(12) United States Patent
Briggs et al.

(10) Patent No.: US 6,432,564 B1
(45) Date of Patent: Aug. 13, 2002

(54) SURFACE PREPARATION OF A SUBSTRATE FOR THIN FILM METALLIZATION

(75) Inventors: Kimberly R. Briggs, Douglas; Robert J. Lamarre; Paul T. Solan, both of Attleboro, all of MA (US)

(73) Assignee: Mini Systems, Inc., Attleboro, MA (US)

( * ) Notice: Subject to any disclaimer, the term of this patent is extended or adjusted under 35 U.S.C. 154(b) by 0 days.

(21) Appl. No.: 09/373,292

(22) Filed: Aug. 12, 1999

(51) Int. Cl.$^7$ .............. B32B 9/04; B32B 17/06; B32B 33/00; C23C 16/40
(52) U.S. Cl. .............. 428/701; 428/426; 428/428; 428/432; 428/336; 428/702; 428/141; 427/585; 427/126.1; 427/126.2; 427/255.29; 427/255.37; 427/255.393
(58) Field of Search .............. 428/426, 432, 428/336, 141, 701, 702, 428; 427/585, 126.1, 126.2, 255.29, 255.37, 255.393

(56) References Cited

U.S. PATENT DOCUMENTS

| | | | |
|---|---|---|---|
| 3,968,193 A | | 7/1976 | Langston, Jr. et al. |
| 4,221,047 A | | 9/1980 | Narken et al. |
| 4,546,016 A | | 10/1985 | Kern |
| 4,622,058 A | * | 11/1986 | Leary-Renick et al. |
| 4,649,070 A | | 3/1987 | Kondo et al. |
| 4,791,005 A | | 12/1988 | Becker et al. |
| 5,097,246 A | | 3/1992 | Cook et al. |
| 5,104,482 A | | 4/1992 | Monkowski et al. |
| 5,382,550 A | | 1/1995 | Iyer |
| 5,409,743 A | | 4/1995 | Bouffard et al. |
| 5,686,790 A | | 11/1997 | Curtin et al. |
| 5,906,861 A | * | 5/1999 | Mack et al. |

OTHER PUBLICATIONS

International Search Report for International Application No. PCT/US00/21213.

\* cited by examiner

*Primary Examiner*—Deborah Jones
*Assistant Examiner*—Jennifer McNeil
(74) *Attorney, Agent, or Firm*—McDermott, Will & Emery

(57) ABSTRACT

A substrate is prepared for thin film metallization by applying one or more substantially conformal films or layers of a silicon glass onto the surface of the substrate. The total thickness of the glass on the substrate is not more than approximately 12,000 to 15,000 Angstroms and preferably between about 4000 and 6000 Angstroms. The glass is preferably deposited substantially uniformly onto the substrate surface so that the topographical features of the underlying substrate are not significantly changed by the presence of the glass.

20 Claims, 1 Drawing Sheet

SURFACE PREPARATION OF A SUBSTRATE FOR THIN FILM METALLIZATION

TECHNICAL FIELD

The present invention relates to substrates used in the fabrication of electronic devices, and more particularly to substrates which are suitable for the application of thin metal films thereon.

BACKGROUND OF THE INVENTION

Increasing numbers of microelectronics and wireless devices require extremely small, extremely reliable electronic components and interconnections, both passive and active, which may be embedded and/or on the surfaces of such devices. Such surface interconnections are typically formed by using thin film metallization techniques to apply conductive traces onto the surface of a substrate. However, these techniques cannot reliably be carried out when the surface roughness of the substrate is greater than about 15 microinches (3750 Angstroms). The term "surface roughness", as used herein, refers to the average difference in the heights of the topographical features within a given area on the surface of a substrate.

Several methods for creating a smoother substrate surface are known. For example, one can polish a substrate to achieve the desired surface finish. However, for some ceramic substrates, the polishing forces can drag constituents of the ceramic out of the matrix, resulting in pitting of the surface.

It is also known to apply a glass layer over the surface of the substrate so as to provide a smooth surface. Such a glass layer establishes a relatively uniform surface topography and is typically applied as a relatively thick paste or slurry, which flows into voids and around peaks on the surface of the substrate, and is then fired to form a glaze. U. S. Pat. Nos. 3,968,193 to Langston, Jr. et al., 5,097,246 to Cook et al., and 5,686,790 to Curtin et al. all disclose such methods.

Alternatively, a thin glass layer can be deposited onto the surface of a substrate by chemical vapor deposition methods and then caused to flow viscoelastically over the surface of the substrate. U. S. Pat. No. 5,104,482 to Monkowski et al. discloses a method wherein a glass layer is deposited onto a substrate and simultaneously flowed viscoelastically over the surface of the substrate so as to planarize the surface of the substrate.

The prior art suggests that it is desirable to fill in or otherwise planarize the inherent surface topography of a substrate to eliminate peaks, valleys and voids in the surface. Glass deposits, as well as glass pastes and slurries, are applied to fill in the surface topography to form a nonconformal coating. However, the prior art does not appear to disclose or suggest the application of a substantially conformal layer or film of glass to the surface of a substrate to prepare the substrate for thin film metallization, without accompanying viscous flow of the glass, and thus without significantly altering the topography of the substrate.

It would therefore be advantageous to provide devices which are suitable for thin film metallization but which do not require a nonconformal coating or the application of a relatively thick glass paste or slurry. It would also be advantageous to provide methods for preparing a substrate for thin film metallization which do not require the use of thick glass pastes or slurries and which do not require glazing of the substrate.

SUMMARY OF THE INVENTION

According to one aspect of the invention, there is provided a method of surface preparation of a substrate for thin film metallization. The method comprises the steps of providing a substrate having a given surface topography, treating the substrate to remove substantially all surface contaminants and moisture from the substrate, and applying one or more substantially conformal glass films or layers to the surface of the substrate.

The term "film", as used herein, refers to a substantially conformal layer of glass which is deposited onto a substrate using known chemical or sputter deposition techniques.

In one embodiment, the substrate may comprise, for example, a cofired ceramic material which may be either a low-temperature or a high-temperature cofired material. Other substrate materials can also be used.

Each glass film layer has a thickness of up to approximately 12,000 to 15,000 Angstroms, and preferably between about 4000 to 6000 Angstroms. Multiple glass film layers of between about 4000 and 6000 Angstroms may be applied. Preferably each glass film layer has a substantially uniform thickness.

The substrate is preferably treated by washing it several times in acid, alcohol and deionized water, and drying it under sufficient heat to remove substantially all moisture in the substrate.

In a preferred embodiment, the conformal glass film or films are applied using chemical vapor deposition techniques.

According to another aspect of the invention, a substrate which is suitable for receiving thin metal films in a predetermined pattern comprises a substrate having a given surface topography, and one or more substantially conformal glass films on the surface of the substrate.

The substrate can be, for example, a cofired ceramic which may be either a high-temperature or a low-temperature cofired ceramic material. Other substrate materials can also be used.

Each glass film layer has a thickness of up to approximately 12,000 to 15,000 Angstroms, and preferably between about 4000 to 6000 Angstroms. Multiple glass film layers of between about 4000 and 6000 Angstroms may be applied. Preferably each glass film layer has a substantially uniform thickness.

These and other objects and advantages of the invention will in part be obvious and will in part appear hereinafter. The invention accordingly comprises the apparatus possessing the construction, combination of elements and arrangement of parts which are exemplified in the following detailed disclosure, the scope of which will be indicated in the claims.

BRIEF DESCRIPTION OF THE DRAWINGS

For a fuller understanding of the nature and objects of the present invention, reference should be made to the following detailed description taken in connection with the accompanying drawings, in which.

Like features in the respective FIGS. are indicated with like numerals.

DETAILED DESCRIPTION OF THE DRAWINGS

Figure 1:
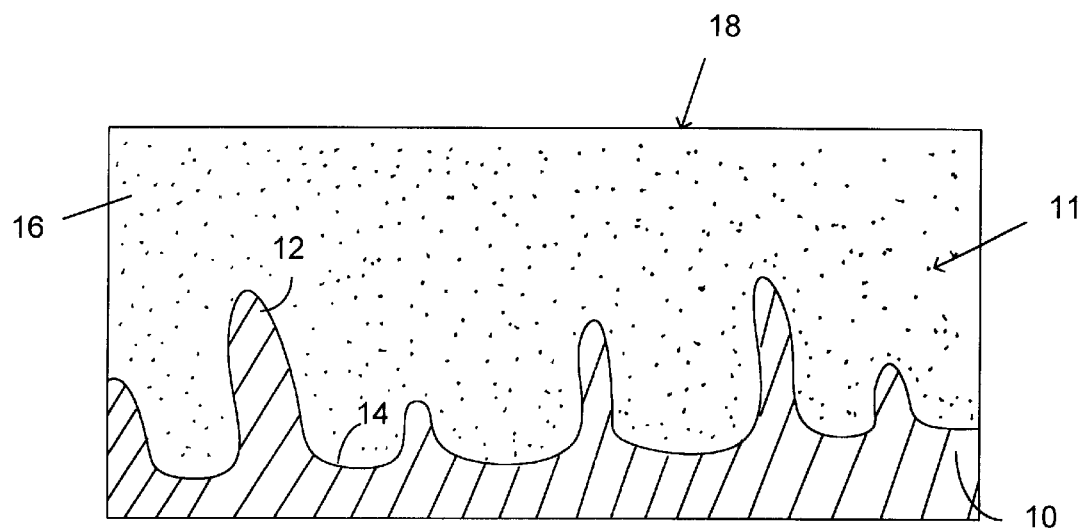
FIG. 1 is a diagram of a substrate to which a glass paste or slurry has been applied according to prior art methods.

FIG. 1 illustrates, in a cross-sectional view, a portion of a substrate 10 which has been prepared according to methods known in the art. The substrate 10 is characterized by an irregular surface topography 11 which includes peaks 12 and valleys 14 of varying heights and depths. An average value for the surface roughness of the substrate 10 can be determined by computing an average of the height differences of the peaks and valleys in a given area of the substrate.

A glass paste or slurry has been applied to the surface of the substrate 10, such as with a doctor blade, and fired to form a substantially nonconformal glass coating 16 over the surface of the substrate. The glass slurry or paste is designed to flow around the peaks and into the valleys so as to fill any voids and create a new surface topography 18 when it is fired.

The glass layer is ideally relatively smooth and devoid of irregularities.

Figure 2:
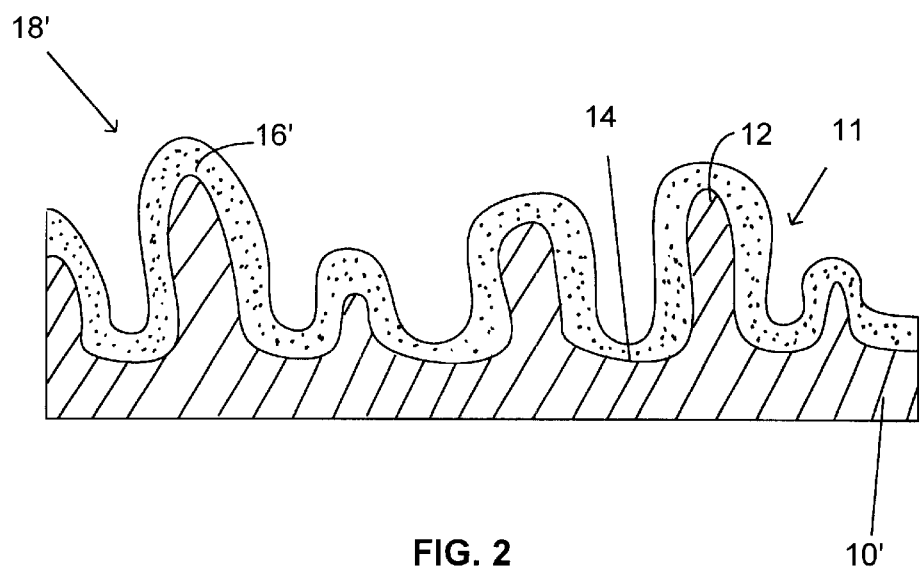
FIG. 2 is a diagram of a substrate to which a glass film has been applied according to the method of the invention.

FIG. 2 illustrates, in a cross-sectional view, a portion of a substrate 10' which has been prepared according to the methods of the present invention. The substrate is also characterized by an irregular surface topography 11, including peaks 12 and valleys 14 of varying heights. The average surface roughness of the substrate 10' can be determined as indicated above.

A thin, substantially conformal layer or film of glass 16' has been applied to the surface of the substrate 10' to a thickness of not greater than about 12,000 to 15,000 Angstroms and preferably between about 4000 to 6000 Angstroms. The glass film 16' is substantially conformal and to a great extent replicates the surface topography of the underlying substrate. The resulting surface topography 18' is smoother than the surface topography 11 of the underlying substrate. The surface roughness of the glass film 16' is attenuated relative to that of the unprepared substrate 10'. The resulting substrate surface 10' is smooth enough for the successful application of thin metal films having a resolution of 0.001 inch, with an accuracy to within 0.0001 inch.

If desired, multiple glass film layers of a thickness not greater than about 4000 to 6000 Angstroms each can be applied.

The substrate can be of any material which is suitable for further processing for receiving thin metal films by known techniques, such as, for example, quartz, glass, or ceramic materials.

Advantages of the use of a thin conformal glass film on the substrate include a more easily controlled, and a more economical, preparation process, as less glass is used and less energy is required because no viscoelastic flow is required. Also, superior thin film metallization of the resulting substrate is made possible using the techniques of the present invention. Conductive trace geometries having widths as fine as 0.001 inch are obtainable and are accurate to within 0.0001 inch using the methods of the present invention. Conductive trace geometries which are patterned on substrates prepared according to the prior art methods cannot be obtained in widths finer than 0.005 inch. An advantage of finer trace widths is that smaller design areas are required.

The following non-limiting example is presented.

EXAMPLE I

To remove contaminants from the surface of a low-temperature cofired ceramic substrate, the substrate is rinsed in a solution of perchloroethylene, dichlorobenzene, phenol, dodecyl benzene and sulfonic acid at a temperature of 90° C.±5° C. for about 2 minutes. The substrate is then rinsed three times in alcohol for 30–45 seconds each rinse. The substrate is then rinsed in deionized water for 30 seconds. The substrate is then dump rinsed three times and air dried. The substrate is then baked for 12 hours at a temperature of 150° C.±5° C. to remove any remaining moisture.

The substrate is masked and patterned according to known photomasking and photoetching techniques and is then placed in a chemical vapor deposition (CVD) reaction chamber, into which is introduced silane and oxygen. The chamber is heated to a temperature of about 350° C. and the substrate is held in the chamber for about 6 to 8 minutes until a film of $SiO_2$ glass having a thickness of between about 4000 and 6000 Angstroms is formed on the substrate surface in the desired pattern. The substrate is masked and patterned according to known photomasking and photoetching techniques to provide opening locations for interconnections.

Conductive interconnection traces are then formed on the surface of the substrate in a desired pattern using known photomasking and photoetching techniques. Tantalum nitride and palladium are deposited according to known sputter deposition techniques to form the traces.

Resistors are defined by using known photomasking techniques. A sputter etch process is then used to selectively remove portions of the resistive layer to form passive resistor components.

The conductive traces on the glass-coated substrate have widths of 0.001 inch which are accurate to within 0.0001 inch.

Such substrates are useful in numerous applications, including, for example, military and aerospace avionics, microwave and millimeter wave telecommunications, personal computing workstations, supercomputers, automotive electronics, consumer electronics and medical electronics. They are used in, for example, modules including multiple integrated circuits, high density ceramic printed circuit boards, MMICs and advanced microelectronic packages.

Because certain changes may be made in the above apparatus without departing from the scope of the invention herein disclosed, it is intended that all matter contained in the above description or shown in the accompanying drawings shall be interpreted in an illustrative and not a limiting sense.

We claim:

1. A method of surface preparation of a substrate for thin film metallization, comprising the steps of:
   providing a substrate having a given surface topography;
   treating the substrate to remove substantially all surface contaminants and moisture from the substrate; and
   applying one or more substantially conformal glass films to the surface of the substrate so as to substantially replicate the surface topography of the substrate without glass reflow.

2. A method according to claim 1, wherein the substrate comprises a cofired ceramic material.

3. A method according to claim 1, wherein the step of applying one or more substantially conformal glass films is carried out using chemical vapor deposition techniques.

4. A method of surface preparation of a substrate for thin film metallization, comprising the steps of:
   providing a substrate having a given surface topography;
   treating the substrate to remove substantially all surface contaminants and moisture from the substrate; and
   applying one or more substantially conformal glass films to the surface of the substrate, wherein each glass film has a thickness of up to approximately 12,000 to 15,000 Angstroms.

5. A method of surface preparation of a substrate for thin film metallization, comprising the steps of:
   providing a substrate having a given surface topography;
   treating the substrate to remove substantially all surface contaminants and moisture from the substrate; and
   applying one or more substantially conformal glass films to the surface of the substrate, wherein each glass film has a thickness of between about 4000 and 6000 Angstroms.

6. A method of surface preparation of a substrate for thin film metallization, comprising the steps of:
   providing a substrate having a given surface topography;
   treating the substrate to remove substantially all surface contaminants and moisture from the substrate; and
   applying one or more substantially conformal glass films to the surface of the substrate, wherein each glass film has a substantially uniform thickness.

7. A method of surface preparation of a substrate for thin film metallization, comprising the steps of:
   providing a substrate having a given surface topography;
   treating the substrate to remove substantially all surface contaminants and moisture from the substrate; and
   applying one or more substantially conformal glass films to the surface of the substrate, wherein the step of treating the substrate comprises the steps of washing the substrate in acid,; alcohol and deionized water, and drying the substrate under sufficient heat to remove substantially all moisture in the substrate.

8. A substrate which is suitable for receiving thin metal films in a predetermined pattern, comprising:
   a substrate having a given surface topography; and
   one or more substantially conformal glass films applied to the surface of the substrate so as to substantially replicate the surface topography of the substrate without glass reflow.

9. A substrate according to claim 8, wherein the substrate having a given surface topography comprises a ceramic material.

10. A substrate according to claim 9, wherein the substrate comprises a cofired low temperature ceramic material.

11. A substrate according to claim 9, wherein the substrate comprises a cofired high temperature ceramic material.

12. A substrate according to claim 8, wherein each glass film has a thickness of up to approximately 12,000 to 15,000 Angstroms.

13. A substrate according to claim 12, wherein each glass film has a thickness of between about 4000 and 6000 Angstroms.

14. A substrate according to claim 8, wherein each glass film has a substantially uniform thickness.

15. A substrate which is suitable for receiving thin metal films in a predetermined pattern, comprising:
   a cofired ceramic substrate having a given surface topography; and
   one or more substantially conformal glass films applied to the surface of the substrate so as to substantially replicate the surface topography of the cofired ceramic substrate without glass reflow.

16. A substrate according to claim 15, comprising a low-temperature cofired ceramic material.

17. A substrate according to claim 15, comprising a high-temperature cofired ceramic.

18. A substrate which is suitable for receiving thin metal films in a predetermined pattern, comprising:
   a cofired ceramic substrate having a given surface topography; and
   one or more substantially conformal glass films applied to the surface of the substrate, wherein each glass film has a thickness of up to approximately 12,000 to 15,000 Angstroms.

19. A substrate which is suitable for receiving thin metal films in a predetermined pattern, comprising:
   a cofired ceramic substrate having a given surface topography; and
   one or more substantially conformal glass films applied to the surface of the substrate, wherein each glass film has a thickness of between about 4000 and 6000 Angstroms.

20. A substrate which is suitable for receiving thin metal films in a predetermined pattern, comprising:
   a cofired ceramic substrate having a given surface topography; and
   one or more substantially conformal glass films applied to the surface of the substrate, wherein each glass film has a substantially uniform thickness.

* * * * *

UNITED STATES PATENT AND TRADEMARK OFFICE
CERTIFICATE OF CORRECTION

PATENT NO.    : 6,432,564 B1
DATED         : August 13, 2002
INVENTOR(S)   : Kimberly R. Briggs et al.

It is certified that error appears in the above-identified patent and that said Letters Patent is hereby corrected as shown below:

Column 6,
Line 20, after "ceramic" add -- material --.

Signed and Sealed this

Fourth Day of February, 2003

JAMES E. ROGAN
*Director of the United States Patent and Trademark Office*